United States Patent
Peczalski et al.

(10) Patent No.: US 6,175,515 B1
(45) Date of Patent: *Jan. 16, 2001

(54) VERTICALLY INTEGRATED MAGNETIC MEMORY

(75) Inventors: Andrzej Peczalski, Eden Prairie; Dale F. Berndt; James F. Detry, both of Plymouth, all of MN (US)

(73) Assignee: Honeywell International Inc., Morristown, NJ (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/224,368

(22) Filed: Dec. 31, 1998

(51) Int. Cl.$^7$ .................................................. G11C 15/02
(52) U.S. Cl. ........................................... 365/50; 365/170
(58) Field of Search ........................................ 365/50, 170

(56) References Cited

U.S. PATENT DOCUMENTS

| | | | |
|---|---|---|---|
| 5,025,416 | 6/1991 | Prinz | 365/170 |
| 5,068,826 * | 11/1991 | Matthews | 365/170 |
| 5,075,247 | 12/1991 | Matthews | 437/52 |
| 5,089,991 | 2/1992 | Matthews | 365/9 |
| 5,289,410 | 2/1994 | Katti et al. | 365/170 |
| 5,295,097 * | 3/1994 | Lienau | 365/170 |
| 5,329,480 | 7/1994 | Wu et al. | 365/170 |
| 5,375,082 | 12/1994 | Katti et al. | 365/45 |
| 5,396,455 | 3/1995 | Brady et al. | 365/170 |
| 5,488,250 | 1/1996 | Hennig | 257/421 |
| 5,504,699 | 4/1996 | Goller et al. | 365/48 |
| 5,572,058 | 11/1996 | Biard | 257/421 |
| 5,652,445 | 7/1997 | Johnson | 257/295 |
| 5,741,435 | 4/1998 | Beetz, Jr. et al. | 252/62.55 |
| 5,989,406 * | 11/1999 | Beetz, Jr. et al. | 205/118 |

FOREIGN PATENT DOCUMENTS

94/03899    2/1994   (WO).

* cited by examiner

Primary Examiner—Trong Phan
Assistant Examiner—M. Tran
(74) Attorney, Agent, or Firm—John G. Shudy, Jr.

(57) ABSTRACT

A vertically integrated magnetic memory with Hall effect sensing or reading. It has a ferromagnetic structure with a nearly enclosed magnetic path, which is a vertical structure integrated on a chip. Each memory cell has a closed magnetic field that has high strength for a strong Hall effect. The magnet is a closed loop, robust reproducible magnet. A memory array of such cells uses little power in that only few cells need to draw the read current for a short time required to read the information. A silicon or GaAs chip implementation of the memory is one embodiment, among others, wherein the field required to saturate the electrons can be achieved without excessive power.

20 Claims, 6 Drawing Sheets

VERTICALLY INTEGRATED MAGNETIC MEMORY

BACKGROUND

The present invention pertains to memory devices. Particularly, it pertains to nonvolatile memory devices, and more particularly, the invention relates to magnetic memories with Hall effect sensing.

The related art appears not to reveal the present Hall-type device, which is a micromachined solid-state, vertical standing memory cell. Other authors have not discovered the operation in the carrier saturation velocity regime, which leads to the highest signal. The device has high reliability and a good high signal memory with low-power consumption. The related art also does not appear to show a vertically structured magnetic memory on an integrated circuit having high density.

SUMMARY OF THE INVENTION

The present invention is a vertically integrated magnetic memory (VIMM) with Hall effect sensing or reading. It has a ferromagnetic structure with a nearly enclosed magnetic path, which is a vertical structure integrated on a chip. The Hall effect is the creation of an electric voltage inside a semiconductor when it is conducting an electric current in the presence of a magnetic field. This electronic field pushes the electronic carriers to one side of the semiconductor, giving rise to the Hall voltage. The Hall voltage is proportional to the applied magnetic field and the electric current. A signal or voltage of a Hall effect can be represented by equation $V_H$ e $\vec{V} \times \vec{H}$. $\vec{V}$ is the velocity of the electron, and e is the charge of the electron. $\vec{H}$ is the magnetic field. The measurement of the Hall voltage can be used to determine the number of current carriers per unit volume within a semiconductor device and also whether the carriers are positively or negatively charged.

Each memory cell has a closed magnetic field that has high strength for a strong Hall effect. The magnet is a closed loop, robust reproducible magnet. A memory array of such cells uses little power in that only few cells need to draw the read current for a short time required to read the information. A silicon chip implementation of the memory is one embodiment wherein the field required to saturate the electrons can be achieved without excessive power. Implementation of the cell may also be in GaAs, indium gallium arsenide, indium phosphide, indium arsenide and so forth which have a lower saturation field than silicon. The GaAs implementation is described below, and is the best approach for the invention. There is a robust differential current readout. Operation of the Hall memory device is at the saturation electric field where the highest electron velocity can be attained for the best Hall effect, which can be shown on an electron velocity versus the electric field graph. Operation in the electron velocity saturation region offers a high read-out signal at low power. The concentric crossection of the device allows for a low power write.

A high density of these memory cells is achieved due to vertical structure and integration of the cells on a substrate. The size of each cell may be as small as a ten-micron square. This size permits up to 10 million cells on a one-centimeter square chip.

Features of the invention relative to comparable prior art are higher carrier velocities, stronger magnetic fields and a robust magnetic circuit design. These features provide for better and more reliable signals, and no creep from half-currents in the write mode from one of the two conductive lines that carry current to change the direction of magnetic field. If the cell is not being addressed, there may be a current in one line, which may weaken the magnetic field in a prior art device. Such half-current does not affect the present cell because of its vertical structure and the closed loop magnetic circuit. Half-select write currents cause a creep of magnetization or domains in half-selected cells, which leads to reliability problems. The closed magnetic loop prevents such creep.

DESCRIPTION OF THE EMBODIMENT

Figure 1A:
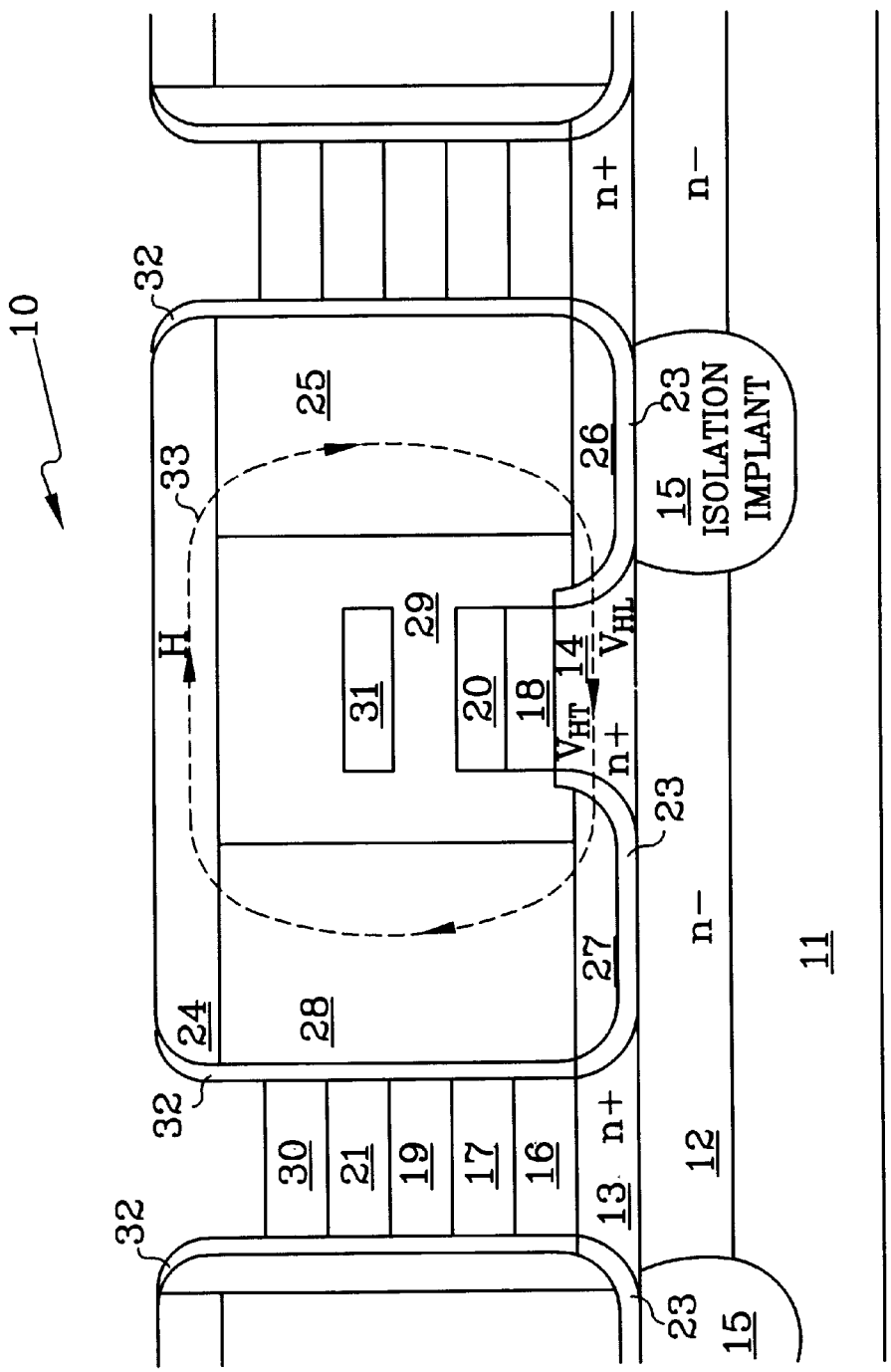
FIGS. 1a and 1b are front cross-section views of the present memory cell.
Figure 1B:
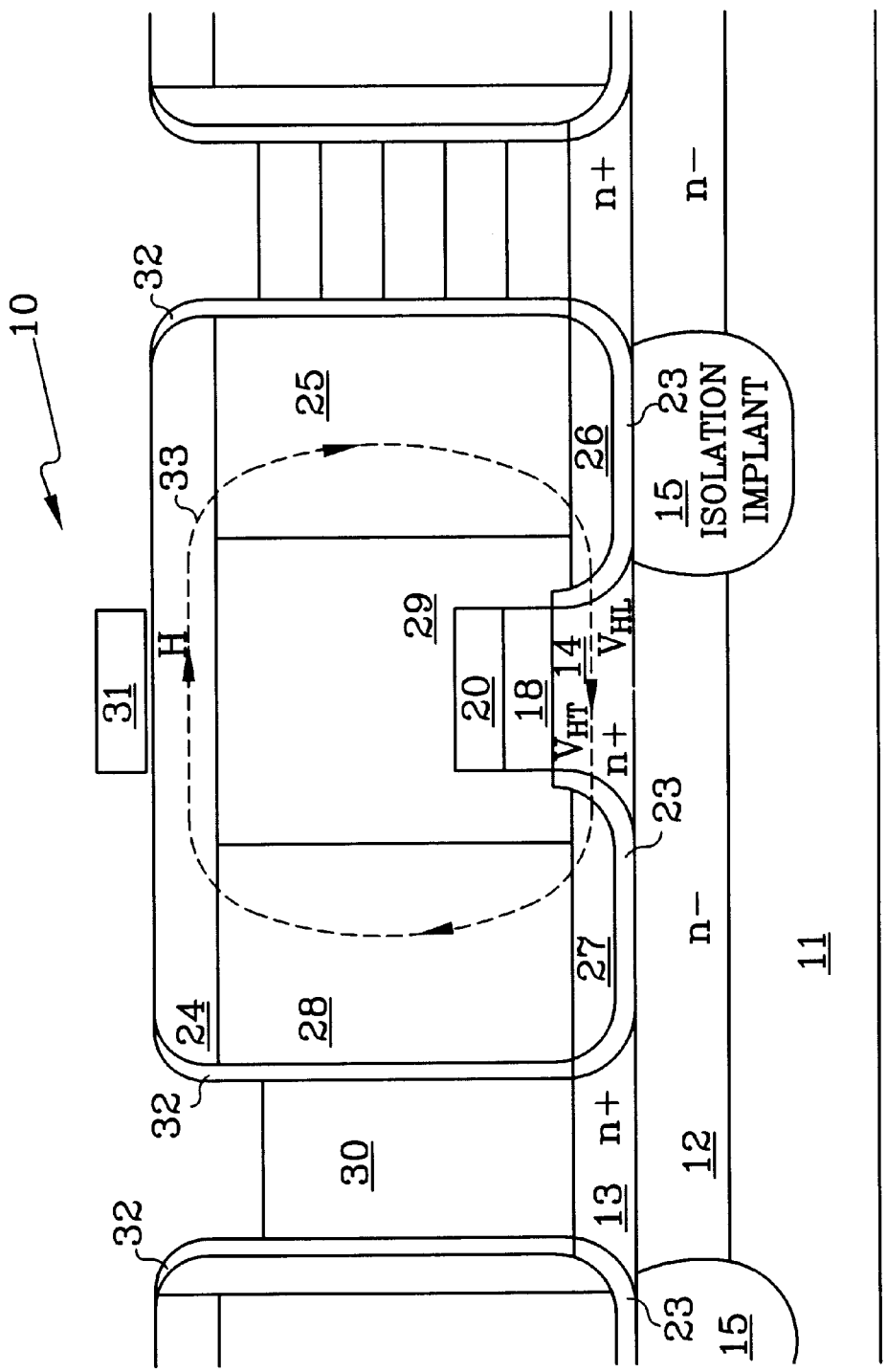

FIGS. 1a and 1b show cross-section views of a Hall effect memory cell 10. A GaAs substrate 11 has a portion 12 implanted with a few silicon ions with a high energy resulting in n– GaAs. Substrate 11 has a portion 14 above portion 12 implanted with a significant number of silicon ions with low to medium energy, resulting in n+ GaAs. Alternatively, the n– and n+ layers could be grown with molecular beam epitaxy or any other crystal growth method. Mesas 13 and 14 are etched from the n+ layer. Portion 14 constitutes the Hall device. Isolation implants 15 are formed with a proton or oxygen ion implant. An ohmic metal layer 16 is formed on mesa 13. Ohmic layer 16 has a via interconnect metal 17 formed on it. Formed on mesa 14 is a metal 18 that is like metal 17, but functions as a Schottky plug. Formed on interconnect via 17 is a first conducting metal 19 (metal one). Another first conducting metal 20 (metal one) is also formed on Schottky plug 18. A metal via interconnect 21 is formed on first metal 19. A second conducting metal 30 is formed on metal via interconnect 21.

A second nitride dielectric film 23 is formed on the side slopes of mesas 13 and 14. Formed between mesas 13 and 14 are lower magnet portions 26 and 27. Formed on magnet portions 26 and 27 are vertical magnet portions 25 and 28, respectively. A second conducting metal 30 (metal two) is formed on interconnecting via 21. Metal 30 goes directly straight to mesa 13 for ultimate connection to mesa 14, as shown in figure 1b. A corresponding second conducting metal 31 (metal two) is formed in between magnet portions 25 and 28 at the same level as conducting metal 30. Metals one and two are typically made of gold. Second metal 31 is suspended away from first metal 20 by dielectric 29, which fills the remaining void between magnet portions 25 and 28. Formed on and bridging vertical magnet portions 25 and 28 is a top magnet portion 24. Dielectric 32 fills in the void between the stack of layers 16, 17, 19, 21 and 30, and vertical magnet portion 28. Also, dielectric 32 is further filled in on the other side of the stack of layers 16, 17, 19, 21 and 30, and a vertical magnet portion of a neighboring cell. Dielectric 32 is further filled in between vertical magnet portion 25 and a stack of layers of another neighboring cell. The top of layer 30 is exposed so that contact can be made to layer 30 with a probe for testing purposes. Dielectric materials 29 and 32 may consist of multiple layers of silicon dioxide, silicon nitride or a similar material.

Figure 2:
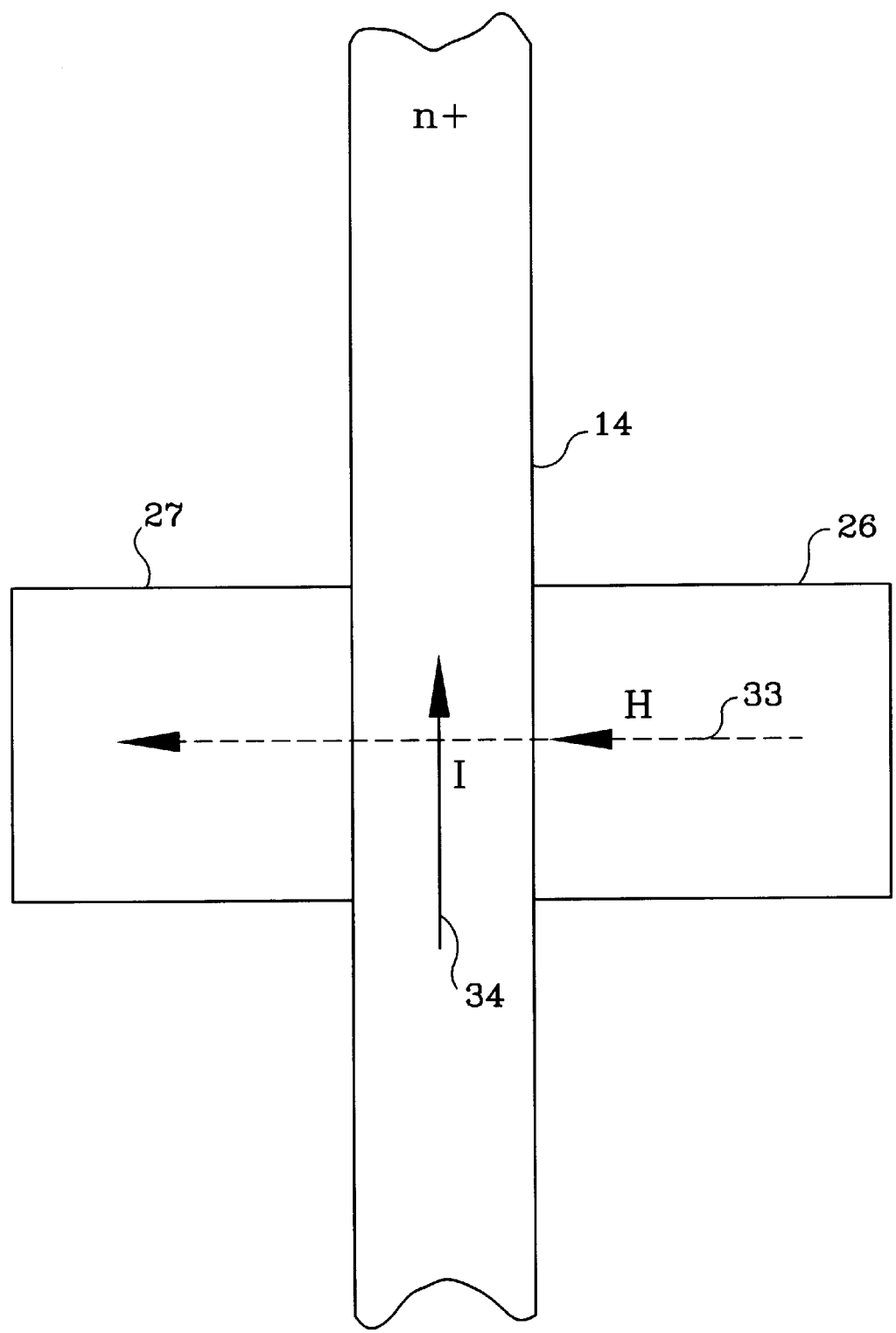
FIG. 2 is a top cross-section view along a current path of the memory cell.
Figure 3A:
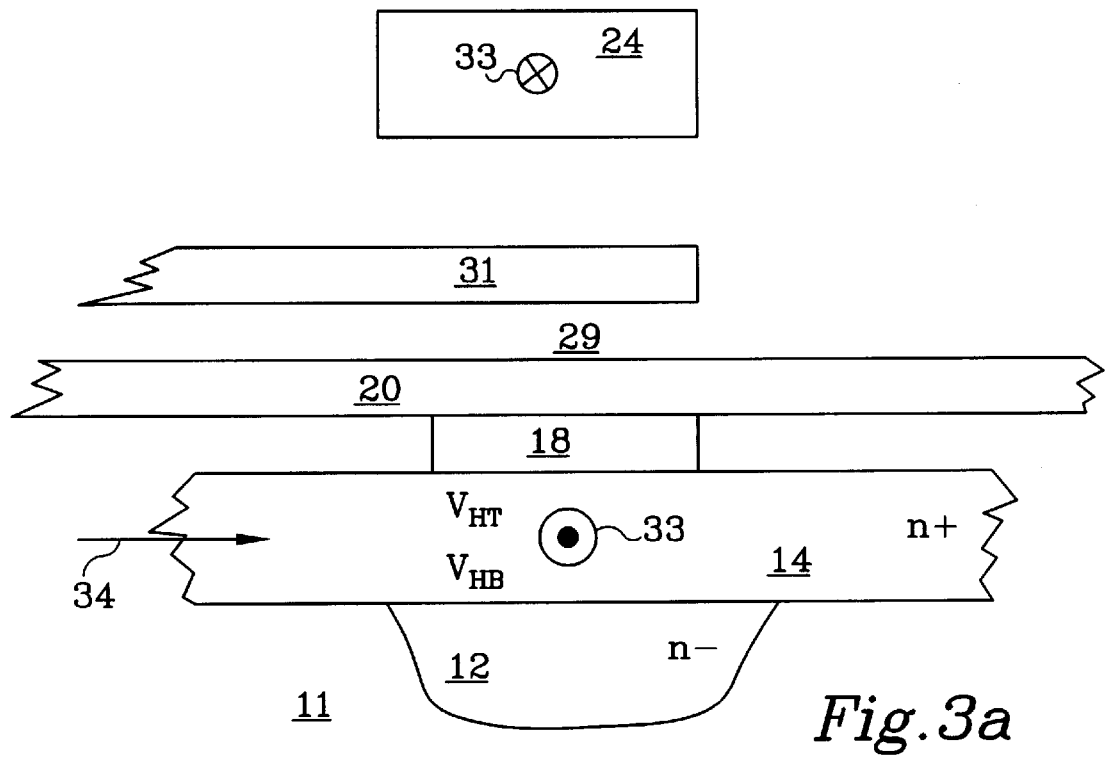
FIGS. 3a and 3b are side cross-section views along a current path of the memory cell.
Figure 3B:
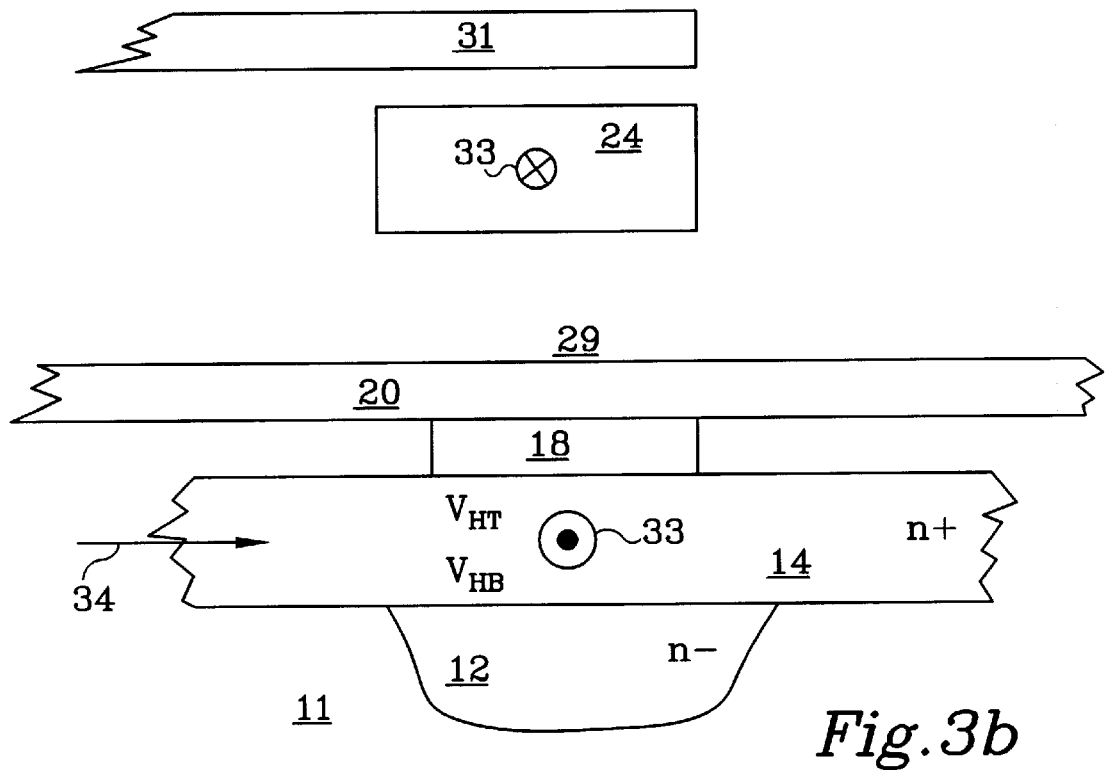

Magnetic portions 24, 25, 26, 27 and 28 provide a nearly closed path for magnetic field (H) 33. The direction (i.e., clockwise) of magnetic field 33 indicates information at memory cell 10 such as, for instance, a digital "1" signal. Thus, a counter-clockwise direction of magnetic field 33 indicates a digital "0" signal. Magnetic field 33 goes through n+ GaAs 14, which is for obtaining a Hall effect to aid in reading memory cell 10. A current (I) 34 flows perpendicular to magnetic field 33 through a bridge-like mesa 14 between magnet portions 26 and 27, as illustrated with a top view in FIG. 2. This interaction results in a Hall effect, which is a voltage difference ($V_{HT} - V_{HB}$) across semiconductor 14 in a direction perpendicular to the directions of field 33 and current 34. $V_{HT}$ is the top Hall voltage in mesa 14 at the border of mesa 14 and Schottky plug 18. $V_{HB}$ is the bottom Hall voltage in mesa 14 at the border of mesa 14 and n− GaAs semiconductor 12. A side view of this Hall effect interaction is also illustrated with a side cross section view in FIGS. 3a and 3b. FIGS. 3a and 3b show metal 31 within the magnetic loop and outside of the loop, respectively. If the direction of magnetic field is reversed, than the polarity of the Hall effect voltage is changed.

Figure 4A:
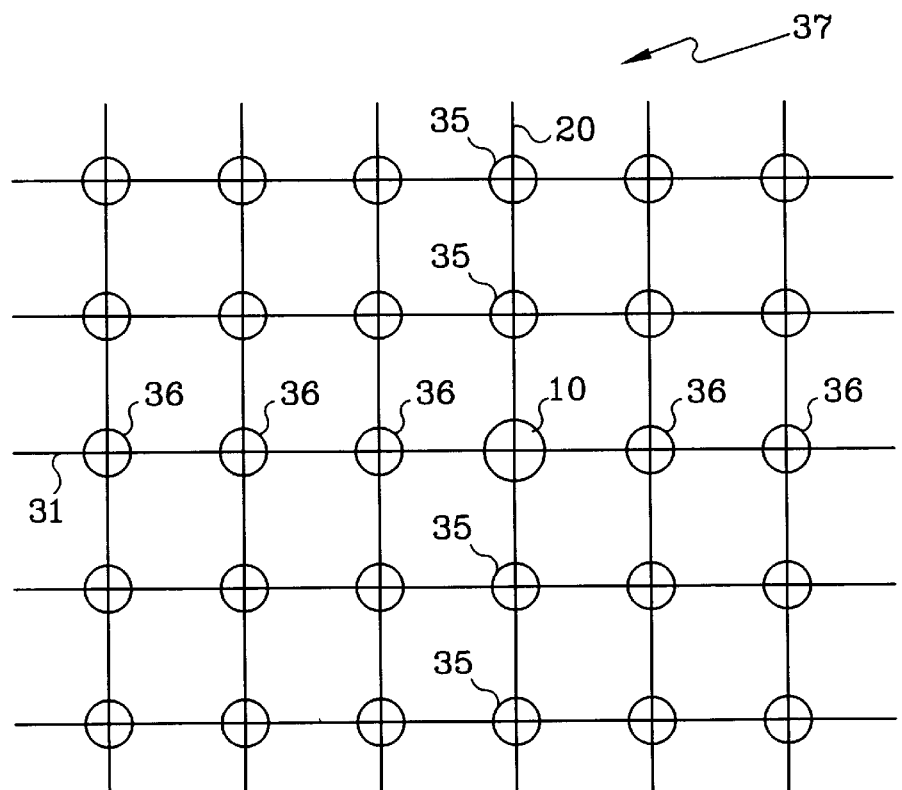
FIGS. 4a and 4b show a memory cell array and a corresponding selection grid, respectively.
Figure 4B:
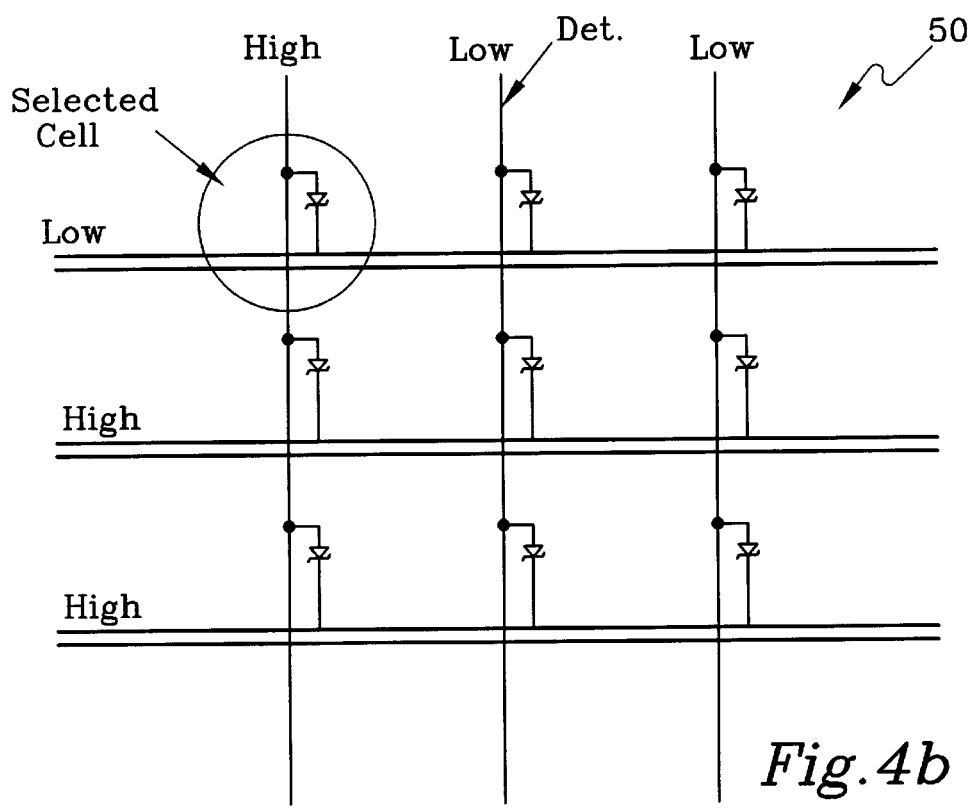

FIG. 4a shows an array 37 of memory cells with write and read lines, wires or metals. For a read or a write of cell 10, line 20 (metal one) and line 31 (metal two) select that cell. All vertical lines are metal one and all horizontal lines are metal two. Just one metal one and one metal two can result in the selection of any cell in array 37. In the case of a write mode, that is, to establish a direction of magnetic field 33, half-currents are applied to lines 20 and 31. These lines intersect at cell 10 and together they provide the effect of a full current to establish the direction of magnetic field 33. The directions of the currents in lines 20 and 31 determine the direction of field 33. Cells 35 and 36 receive half currents from lines 20 and 31, respectively. However, there is no concern of creep of magnetization or domain because cells 35 and 36 have a closed magnetic loop design like that of cell 10. FIG. 4b shows a Schottky diode selection grid 50.

In the sense mode, line 20 (metal one) and line 31 (metal two) select cell 10. A metal one and a metal two can select any particular cell in array 37. No currents are applied in the sensing mode of array 37. Instead voltages are detected to determine the state (i.e., a "1" or a "0") of cell 10, for example. Metal one (line 20) is connected within cell 10 so as to be able to sense the Hall top voltage ($V_{HT}$) via Schottky plug 18. Metal two (line 31) is connected within cell 10 so as to be able to sense the Hall bottom voltage ($V_{HB}$). The magnitudes and polarities of these Hall voltages can be determined relative to substrate 11 or a system ground or reference voltage. The magnitude and/or the sign of the difference of these voltages ($V_{HT}-H_{HB}$) indicates the state of cell 10. The same principles of sensing apply to the other cells of array 37.

In FIGS. 1a and 1b, magnet portions 25, 26, 27 and 28 are composed of soft magnetic material. Magnet portion 24 is composed of a hard magnetic material. Magnet portion 24 is the portion of the magnetic circuit, which holds the direction of magnetic field 33, until a change is effected by half current from line 20 and 31. Magnet portion 24 ensures the non-volatility of cell 10. Metal 31 may be within the magnetic loop as in FIG. 1a or outside of it as in FIG. 1b.

Figure 5:
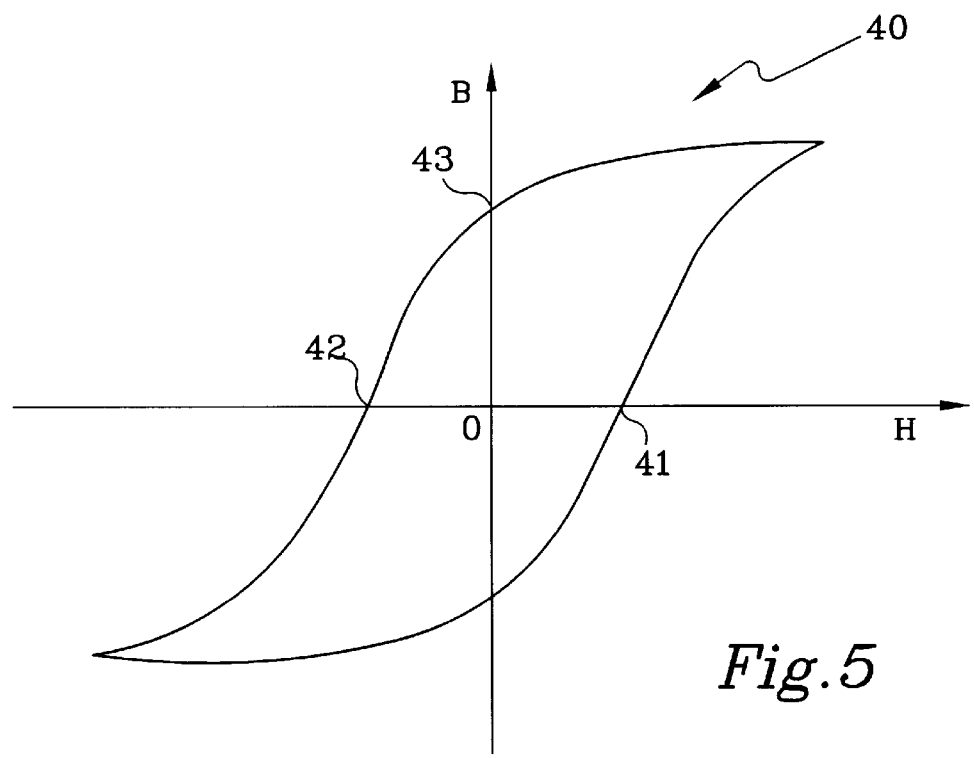
FIG. 5 is a hysteresis curve of the magnetic element of the memory cell.
Figure 6:
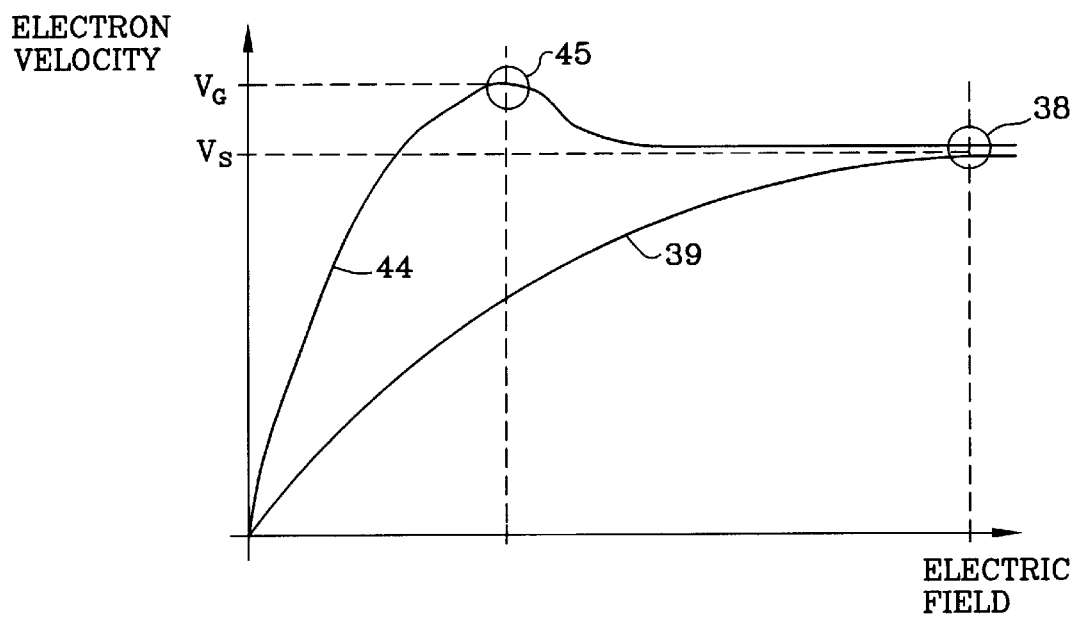
FIG. 6 is a graph of electron velocity versus electric field intensity.

FIG. 5 is a representation of a hysteresis loop 40 that illustrates what is hard magnetic material or soft material. Along the x-axis is H, which stands for magnetizing force. B along the y-axis represents magnetic flux density. Curve intersections 41 and 42 reveal a coercive field force $H_C$ of a magnetic material. Coercive force is measured in oersteds. An oersted is a centimeter-gram-second electromagnetic unit of magnetic intensity equal to the intensity of a magnetic field in a vacuum in which a unit magnetic pole experiences a mechanical force of one dyne in the direction of the field. A curve intersection 43 represents the strength of the magnetic field of the magnetic material. Magnetic materials having a coercive force less than 10 oersteds are considered soft and those greater than 10 oersteds are considered hard. The soft magnet portions 25, 26, 27 and 28 have a coercive field force of about one oersted. However, hard magnet portion 24 has a force of about 30 oersteds. Portion 24 holds the information for cell 10. These values in the magnetic loop provide for high signals and reliability of memory cell 10.

As noted above, the Hall effect signal is given by equation $V_H$ e $\dot{V} \times \dot{H}$. $\dot{H}$ is the magnetic field and e is the charge of the electron. $\dot{V}$ is the velocity of the electron. So maximum electron velocity is important for optimum Hall effect in cell 10 sensing. Optimum Hall effect provides for greater $V_{HT}-V_{HB}$ signals for sensing. For a silicon-based memory cell the saturation velocity for an electron is shown by $V_S$. Curve 39 is the electron velocity versus electric field for silicon. Area 38 indicates the electric field magnitude that corresponds to $V_S$. Curve 44 is the electron velocity versus electric field for gallium arsenide (GaAs). $V_G$ shows the saturation velocity of an electron for GaAs. Area 45 indicates the electric field magnitude that corresponds to $V_G$. As can be seen, GaAs provides for a higher saturation electron velocity for less electric field than silicon. Again, most desirable is the highest possible electron velocity for maximum Hall effect, and thus readout signal, which is provided with a minimal amount of read voltage for low power consumption, high performance and superb reliability.

Cell 10 and resulting arrays may have a variety of enhanced systems or abbreviated arrangements not presently described in great detail. Not describing every possible embodiment or permutation does not detract from or minimize the invention and its merit or spirit as disclosed here.

What is claimed is:

1. A Hall effect memory comprising:
   a ferromagnetic structure formed on a substrate, said ferromagnetic structure having a gap providing a nearly closed loop path for a magnetic field; and
   a semiconductor on the substrate and formed within said gap of said ferromagnetic structure.

2. The Hall effect memory of claim 1, further comprising a conductor connected to said semiconductor and proximate to said ferromagnetic structure.

3. The Hall effect memory of claim 2, wherein:
   said Hall effect memory has a write mode and a read mode;
   said ferromagnetic structure has a first or a second state;
   in the read mode, said conductor senses a Hall voltage from said semiconductor, indicating a first or second state of said ferromagnetic structure; and
   in the write mode, said conductor provides a current to said Hall effect memory cell to place said ferromagnetic structure into a first or a second state.

4. The Hall effect memory of claim 3, wherein said semiconductor is an ungated Hall effect semiconductor that functions in a mode with electrons at a saturation velocity.

5. The Hall effect memory of claim 4, wherein said ferromagnetic structure has a magnetic loop that is in a plane approximately perpendicular to a significant surface of the substrate.

6. The Hall effect memory of claim 5, wherein the substrate and said semiconductor comprise gallium arsenide.

7. The Hall effect memory of claim 5, wherein the substrate and said semiconductor comprise silicon.

8. A magnetic memory comprising a plurality of memory cells on a substrate, wherein each memory cell comprises:

a semiconductor mesa formed on said substrate; and a ferromagnetic closed loop structure with said semiconductor mesa in a gap formed in said ferromagnetic closed loop structure, formed on said substrate, having flux flowing through said ferromagnetic closed loop structure and said semiconductor mesa; and wherein:

said memory cell has a write mode and a read mode;

said ferromagnetic closed loop structure has a first or a second state;

in the read mode, a Hall voltage from said semiconductor mesa indicates a first or second state of said ferromagnetic closed loop structure; and in the write mode, a current places said ferromagnetic closed loop structure into a first or a second state.

9. The magnetic memory of claim 8, further comprising a conductor connected to said semiconductor mesa for conducting the Hall voltage from said semiconductor mesa and for providing the current that places said ferromagnetic closed loop structure into a first or second state.

10. The magnetic memory of claim 9, wherein said semiconductor mesa operates in the electron velocity saturation region.

11. The magnetic memory of claim 10, wherein:

said semiconductor mesa is formed on a significant surface of said substrate;

said ferromagnetic closed loop structure is formed on the significant surface of said substrate; and the flux has a path in said ferromagnetic closed loop structure, which is in a plane that is approximately perpendicular to the significant surface of said substrate.

12. A magnetic memory comprising:

a metallic structure formed on a significant surface of a substrate, said magnetic structure having a gap providing a nearly closed loop path for a magnetic field; and a magnetic sensing portion formed on the significant surface of the substrate and situated within said gap formed in said metallic structure.

13. The magnetic memory of claim 12, wherein:

a magnetic field sensed by said magnetic sensing portion of said closed loop metallic structure is approximately parallel to the significant surface of the substrate; and said closed loop metallic structure is in a plane approximately perpendicular to the significant surface of the substrate; and wherein said magnetic memory has a write mode and a read mode.

14. The magnetic memory of claim 13, further comprising a conductor connected to said magnetic sensing portion for the read mode and proximate to said closed loop metallic structure for the write mode.

15. The magnetic memory of claim 14, wherein:

said closed loop metallic structure has a first or a second state;

in the read mode, said conductor senses a voltage from said magnetic sensing portion, indicating a first or second state of said closed loop metallic structure; and in the write mode, said conductor provides a current proximate to said closed loop metallic structure to place said closed loop metallic structure into a first or a second state.

16. The magnetic memory of claim 15, wherein said magnetic sensing portion is a Hall effect semiconductor.

17. The magnetic memory of claim 16, wherein the Hall effect semiconductor senses the magnetic field with electrons at a saturation velocity.

18. The magnetic memory of claim 17, wherein the Hall effect semiconductor is an ungated semiconductor.

19. The magnetic memory of claim 18, wherein the substrate and the Hall effect semiconductor comprise gallium arsenide.

20. The magnetic memory of claim 18, wherein the substrate and the hall effect semiconductor comprise silicon.

* * * * *